United States Patent
Jin et al.

(10) Patent No.: US 6,771,122 B2
(45) Date of Patent: Aug. 3, 2004

(54) DC OFFSET COMPENSATION CIRCUIT OF CLOSED LOOP OPERATIONAL AMPLIFIER AND METHOD OF COMPENSATING FOR DC OFFSET

(75) Inventors: Woo-kang Jin, Suwon (KR); Moon-sik Song, Bucheon (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 10/394,889

(22) Filed: Mar. 21, 2003

(65) Prior Publication Data

US 2003/0206054 A1 Nov. 6, 2003

(30) Foreign Application Priority Data

May 3, 2002 (KR) .............................. 10-2002-0024485

(51) Int. Cl.[7] .............................................. H03F 3/45
(52) U.S. Cl. ...................... 330/69; 330/259; 330/290
(58) Field of Search .............................. 330/9, 69, 84, 330/85, 252, 259, 290

(56) References Cited

U.S. PATENT DOCUMENTS

| | | | |
|---|---|---|---|
| 5,699,012 A | 12/1997 | Hakkarainen | 330/9 |
| 5,898,912 A | 4/1999 | Heck et al. | 455/234.2 |
| 6,031,420 A | 2/2000 | Voorde | 330/9 |
| 6,137,356 A | 10/2000 | Sakuragi | 330/86 |
| 6,198,350 B1 * | 3/2001 | Zarabadi | 330/9 |
| 6,329,876 B1 * | 12/2001 | Llewellyn | 330/69 |

FOREIGN PATENT DOCUMENTS

| | | | | |
|---|---|---|---|---|
| JP | 60224017 | 11/1985 | | |
| JP | 6152281 | 5/1994 | ............. | H03F/3/68 |
| JP | 7231227 | 8/1995 | ............. | H03F/3/34 |
| JP | 7240640 | 9/1995 | ............. | H03F/3/34 |
| JP | 8250939 | 9/1996 | ............. | H03F/3/34 |
| JP | 9036676 | 2/1997 | ............. | H03G/3/10 |
| JP | 9238034 | 9/1997 | ............. | H03F/3/68 |
| JP | 2000-25770 | 9/2000 | ............. | H03F/3/34 |
| JP | 2001044770 | 2/2001 | | |
| KR | 1019990039084 | 6/1999 | ............. | H03G/3/00 |
| KR | 1019990069058 | 9/1999 | ............. | H01L/21/66 |

* cited by examiner

*Primary Examiner*—Khanh Van Nguyen
(74) *Attorney, Agent, or Firm*—Mills & Onello, LLP

(57) ABSTRACT

A DC offset compensation circuit, and method thereof are capable of reducing the settling time of an output signal through fast compensation of a DC offset of the output signal although a DC voltage of an input signal varies in a closed loop operational amplifier. The DC offset compensation circuit of a closed loop operational amplifier includes a first closed loop operational amplifier and a second closed loop operational amplifier. The first closed loop operational amplifier amplifies an input signal based on a compensation voltage. The second closed loop operational amplifier amplifies a signal output from the first closed loop operational amplifier based on a reference voltage to generate a final output signal. The DC offset compensation circuit receives the final output signal, detects a DC voltage of the final output signal that varies with a variation in a DC voltage of the input signal, and supplies the compensation voltage corresponding to the DC voltage of the final output signal to the first closed loop operational amplifier. The DC offset compensation circuit includes a buffer, a low-pass filter, and a comparator. The buffer buffers the final output signal. The low-pass filter low-pass filters a signal output from the buffer to detect a DC voltage value of the signal. The comparator compares the DC voltage value with the reference voltage and generates the compensation voltage based on the compared result.

16 Claims, 3 Drawing Sheets

DC OFFSET COMPENSATION CIRCUIT OF CLOSED LOOP OPERATIONAL AMPLIFIER AND METHOD OF COMPENSATING FOR DC OFFSET

RELATED APPLICATIONS

This application claims the priority of Korean Patent Application No. 2002-24485 filed on May 3, 2002 in the Korean Intellectual Property Office, the disclosure of which is incorporated herein in its entirety by reference.

BACKGROUND OF THE INVENTION

1. Field of the Invention

The present invention relates to DC offset compensation, and more particularly, to a DC offset compensation circuit of a closed loop operational amplifier and a method of compensating for DC offset.

2. Description of the Related Art

An operational amplifier is a basic element of an analog circuit. Of the characteristics of the operational amplifier, the input offset voltage is a voltage that is applied to an input node to cause the output voltage to be 0V. The offset voltage can vary, depending on the manufacturing process and the operating temperature. The offset voltage can be classified as a systematic offset voltage and a random offset voltage, according to characteristics of factors that generate it. Systematic offset voltage is determined based on design parameters and can be reduced if the size of a transistor is set so that DC current flows fully through it. The random offset voltage is generated based on manufacturing process parameters, e.g., an error in the size of a transistor, variations in threshold voltage, and the like, and can be mitigated if the size of the transistor is increased.

However, although the operational amplifier is designed using a transistor matching process such that the systematic offset voltage is not generated, the random offset voltage, as stated above, is generated according to the manufacturing process, layout mismatch, and the like. If the closed loop gain of the operational amplifier is greater than "1", the output DC offset becomes greater by the closed loop gain. One method of removing the DC offset utilizes a high-pass filter (HPF), as shown in FIG. 1, in which the settling time becomes longer as the DC voltage of the input signal varies.

FIG. 1 is a block diagram of a closed loop operational amplifier having a conventional DC offset compensation circuit utilizing a high-pass filter (HPF). Referring to FIG. 1, a resistor R1 is connected between an input node to which an input signal Vin is input at a negative input node of a first operational amplifier 11. A resistor R2 is connected between the negative input node of the first operational amplifier 11 and an output node of the first operational amplifier 11. A resistor R3 is connected between the output node of the first operational 11 and a negative input node of a second operational amplifier 13. A resistor R4 is connected between the negative input node of the second operational amplifier 13 and an output node of the second operational amplifier 13. A reference voltage Vref is input to a positive input node of the first operational amplifier 11 and a positive input node of the second operational amplifier 13. A DC offset compensation circuit 15 including the HPF is connected to an output node of the second operational amplifier 13.

It is assumed that a gain of the closed loop operational amplifier is (R2/R1)*(R4/R3). Thus, if an input DC offset is distorted by about 10 mV, the output DC offset is distorted by 10 mV*(R2/R1)*(R4/R3). In order to prevent the DC offset from varying, in the prior art, the DC offset compensation circuit 15 including the HPF is connected to the output node of the second operational amplifier 13.

FIG. 2 is a graph illustrating compensation simulation results using the circuit shown in FIG. 1. As seen in FIG. 2, when a DC voltage of the input signal Vin varies from 2.3V to 2.7V, output signal Vout requires a considerable amount of time to reach the desired DC voltage level, i.e., 2.5V. As a result, the output signal Vout does not have a continuous variation in the DC voltage of the input signal Vin. In other words, the settling time of the output signal Vout becomes longer.

SUMMARY OF THE INVENTION

To address the above-described limitations of the conventional embodiments, it is a first object of the present invention to provide a DC offset compensation circuit which is capable of reducing the settling time of an output signal through fast compensation for a DC offset of the output signal, although the DC voltage of the input signal varies in a closed loop operational amplifier.

It is a second object of the present invention to provide a closed loop operational amplifier having such a DC offset compensation circuit.

It is a third object of the present invention to provide a method of compensating for DC offset in which the settling time of an output signal can be reduced through fast compensation for the DC offset of the output signal, although the DC voltage of the input signal varies in a closed loop operational amplifier.

To achieve the first object, there is provided a DC offset compensation circuit of a closed loop operational amplifier having a first closed loop operational amplifier which amplifies an input signal based on a first reference voltage, and a second closed loop operational amplifier which amplifies a signal output from the first closed loop operational amplifier based on a second reference voltage to generate a final output signal. The DC offset compensation circuit includes a buffer, a low-pass filter, and a comparator. The buffer buffers a signal output from the second closed loop operational amplifier. The low-pass filter low-pass filters a signal output from the buffer and detects a DC voltage value of the signal. The comparator compares the DC voltage value with the second reference voltage, generates a compensation voltage based on the compared result, and supplies the compensation voltage as the first reference voltage to the first closed loop operational amplifier.

A cut-off frequency of the low-pass filter varies with a frequency of the input signal. According to a preferred embodiment, the comparator includes an operational amplifier, a first resistor, and a second resistor. The operational amplifier receives the detected DC voltage value at a positive input node. The first resistor is connected between a negative input node of the operational amplifier and the second reference voltage. The second resistor is connected between the negative input node of the operational amplifier and an output node of the operational amplifier.

To achieve the second object, there is provided a closed loop operational amplifier including a first closed loop operational amplifier, a second closed loop operational amplifier, and a DC offset compensation circuit. The first closed loop operational amplifier amplifies an input signal based on a compensation voltage. The second closed loop operational amplifier amplifies a signal output from the first closed loop operational amplifier based on a reference voltage to generate a final output signal. The DC offset compensation circuit receives the final output signal, detects a DC voltage of the final output signal that varies with a variation in a DC voltage of the input signal, and supplies the compensation voltage corresponding to the DC voltage of the final output signal to the first closed loop operational amplifier.

According to a preferred embodiment, the DC offset compensation circuit includes a buffer which buffers the final output signal, a low-pass filter which low-pass filters a signal output from the buffer to detect a DC voltage value of the signal, and a comparator which compares the DC voltage value with the reference voltage and generates the compensation voltage based on the compared result. A cut-off frequency of the low-pass filter varies with a frequency of the input signal. According to the preferred embodiment, the comparator includes an operational amplifier which receives the detected DC voltage value at a positive input node, a first resistor which is connected between a negative input node of the operational amplifier and the reference voltage, and a second resistor which is connected between the negative input node of the operational amplifier and an output node of the operational amplifier.

To achieve the third object, there is provided a method of compensating a DC offset of a closed loop operational amplifier having a first closed loop operational amplifier which amplifies an input signal based on a first reference voltage and a second closed loop operational amplifier which amplifies a signal output from the first closed loop operational amplifier based on a second reference voltage to generate a final output signal. In the method, a signal output from the second closed loop operational amplifier is buffered. The buffered output signal is low-pass filtered to detect a DC voltage value of the buffered output signal. The detected DC voltage value is compared with the second reference voltage and generating a compensation voltage based on the compared result. The compensation voltage is supplied as the first reference voltage to the first closed loop operational amplifier.

When low-pass filtering the buffered output signal, the cut-off frequency varies with the frequency of the input signal.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF PREFERRED EMBODIMENTS

Figure 1:
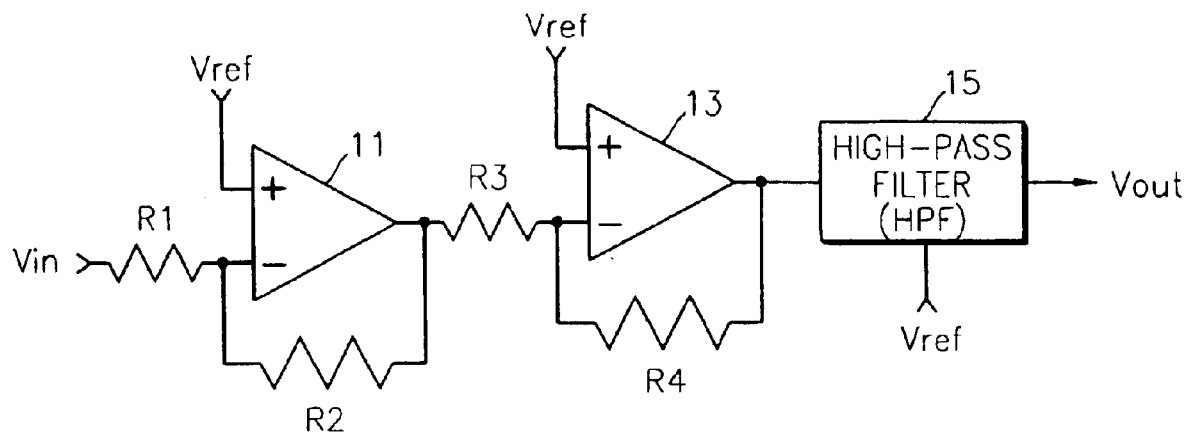
FIG. 1 is a block diagram of a closed loop operational amplifier having a conventional DC offset compensation circuit using a high-pass filter (HPF)

Attached drawings for illustrating a preferred embodiment of the present invention, and the contents written on the attached drawings are referred to in order to gain a sufficient understanding of the merits of the present invention and the operation thereof and the objects accomplished by the operation of the present invention.

Hereinafter, the present invention will be described in detail by explaining a preferred embodiment of the present invention with reference to the attached drawings. Like reference numerals in the drawings denote the same members.

Figure 3:
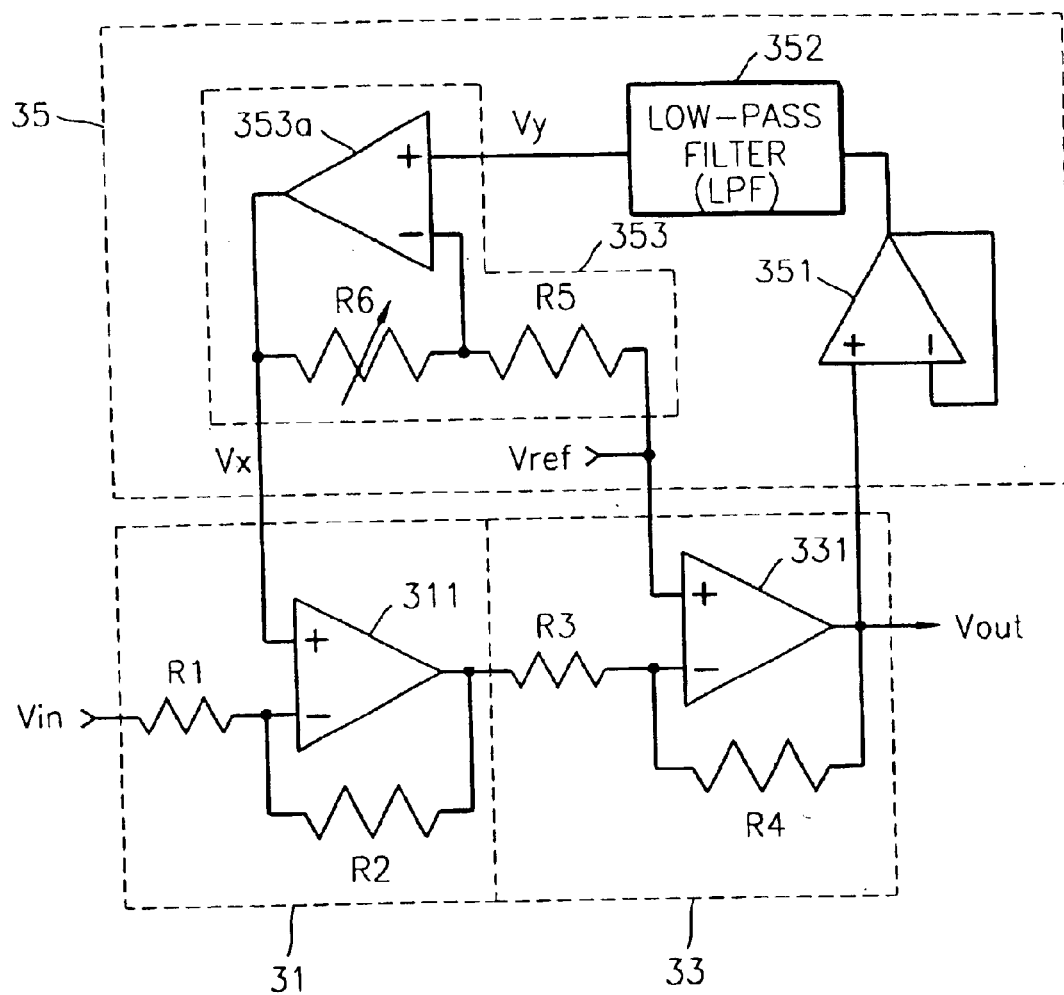
FIG. 3 is a block diagram of a closed loop operational amplifier having a DC offset compensation circuit according to an embodiment of the present invention.

FIG. 3 is a block diagram of a closed loop operational amplifier having a DC offset compensation circuit according to an embodiment of the present invention. Referring to FIG. 3, the closed loop operational amplifier includes a first closed loop operational amplifier 31, a second closed loop operational amplifier 33, and a DC offset compensation circuit 35.

The first closed loop operational amplifier 31 amplifies an input signal Vin based on a first reference voltage, i.e., a compensation voltage Vx. The first closed loop operational amplifier 31 includes an operational amplifier 311, a resistor R1, and a resistor R2. The operational amplifier 311 receives the first reference voltage, i.e., the compensation voltage Vx, via a positive input node. The resistor R1 is connected between a negative input node of the operational amplifier 311 and the input signal Vin. The resistor R2 is connected between the negative input node of the operational amplifier 311 and an output node of the operational amplifier 311.

The second closed loop operational amplifier 33 amplifies a signal output from the first closed loop operational amplifier 311 to generate a final output signal Vout based on a second reference voltage Vref. The second closed loop operational amplifier 33 includes an operational amplifier 331, a resistor R3, and a resistor R4. The operational amplifier 331 receives the second reference voltage Vref via a positive input node. The resistor R3 is connected between a negative input node of the operational amplifier 331 and the output node of the first closed loop operational amplifier 31. The resistor R4 is connected between the negative input node of the operational amplifier 331 and an output node of the operational amplifier 331.

The DC offset compensation circuit 35 is a DC offset compensation circuit according to the present invention which is operated by a method of compensating for DC offset according to the present invention. In other words, the DC offset compensation circuit 35 receives the final output signal Vout, detects the variance of the DC voltage of the final output signal Vout with respect to variation in the DC voltage of the input signal Vin, and generates the compensation voltage Vx corresponding to the DC voltage of the output signal Vout.

The DC offset compensation circuit 35 includes a buffer 351, a low-pass filter (LPF) 352, and a comparator 353. The buffer 351 buffers the final output signal Vout. The LPF 352 low-pass filters a signal output from the buffer 351 to detect a DC voltage value Vy of the signal. The LPF 352 is configured so that the cut-off frequency varies with the frequency of the input signal Vin.

The comparator 353 compares the DC voltage value Vy with the second reference voltage Vref and generates the compensation voltage Vx based on the compared result. If the DC voltage value Vy matches the second reference voltage Vref, the DC voltage value Vy is further used. The comparator 353 includes an operational amplifier 353a, a resistor R5, and a resistor R6. The operational amplifier 353a receives the detected DC voltage value Vy via a positive input node. The resistor R5 is connected between a negative input node of the operational amplifier 353a and the second reference voltage Vref. The resistor R6 is connected between the negative input node of the operational amplifier 353a and an output node of the operational amplifier 353a.

In the above-described closed loop operational amplifier according to the present invention, the cut-off frequency of the LPF 352 in the DC offset compensation circuit 35 varies with the frequency of the input signal Vin. Thus, the setting time of the output signal Vout can be adjusted. The settling time of the output signal Vout can also be adjusted by varying a feedback gain (R6/R5) in the DC offset compensation circuit 35. For example, as the feedback gain (R6/R5) increases, the settling time of the output signal Vout becomes shorter. In the example shown, resistor R6 is a variable resistor for adjusting the feedback gain.

Figure 2:
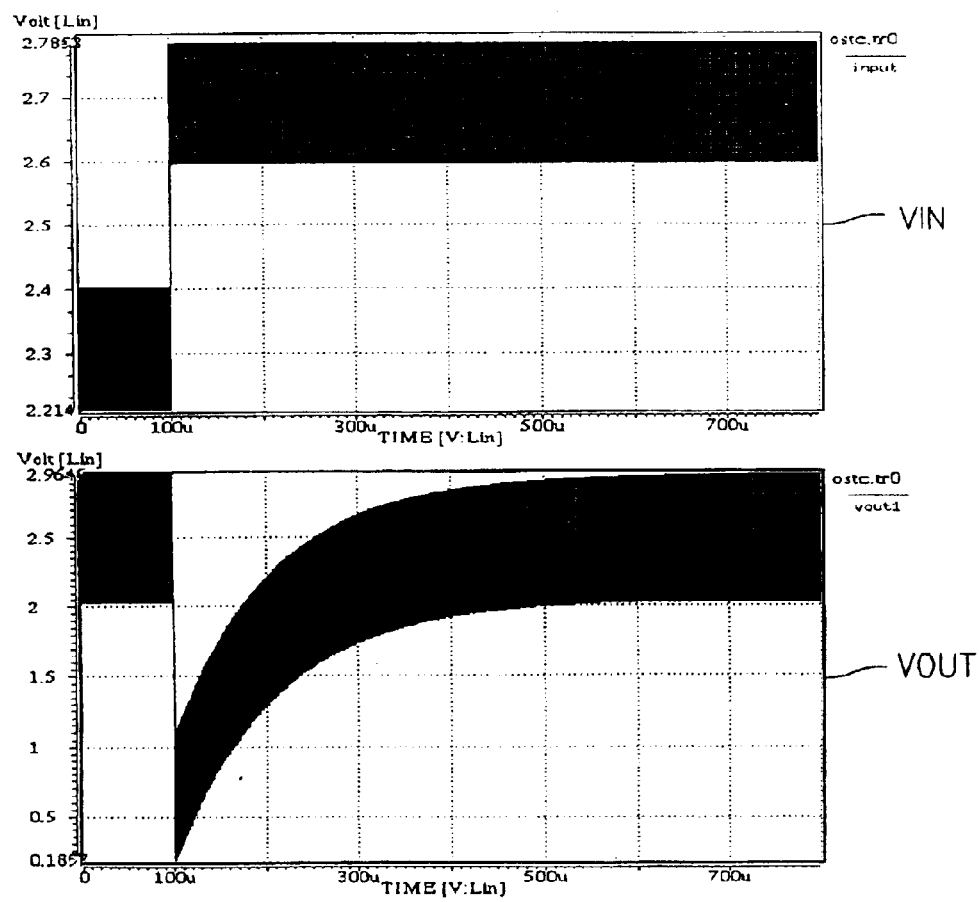
FIG. 2 is a graph illustrating compensation simulation results using the circuit shown in FIG. 1.
Figure 4:
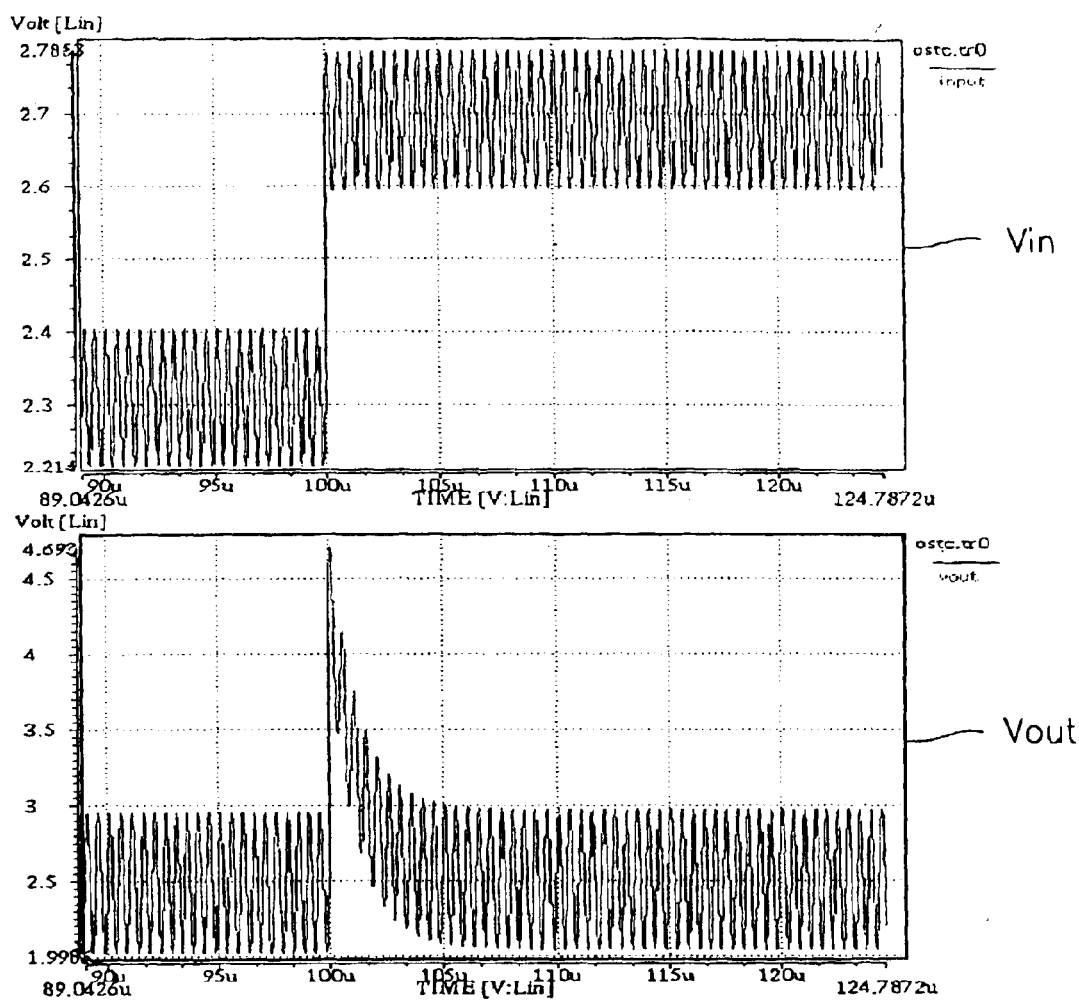
FIG. 4 is a graph illustrating compensation simulation results using the circuit shown in FIG. 3.

FIG. 4 is a graph illustrating compensation simulation results using the circuit shown in FIG. 3. Referring to FIG. 4, when the DC voltage of the input signal Vin varies from 2.3V to 2.7V, the output signal Vout rapidly becomes a desired DC voltage level, i.e., 2.5V. In other words, the settling time of the output signal Vout is much reduced, as compared to that of the conventional embodiments described above. As seen in FIG. 2, the settling time of the output signal Vout is 500 us or more in the prior art shown in FIG. 1 while in the present invention, the settling time of the output signal Vout is about 7 us as seen in FIG. 4.

As described above, in the DC offset compensation circuit and the method of compensating a DC offset according to the present invention, the settling time of the output signal can be reduced through fast compensation of the DC offset of the output signal although the DC voltage of the input signal varies in the closed loop operational amplifier.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A DC offset compensation circuit of a closed loop operational amplifier having a first closed loop operational amplifier which amplifies an input signal based on a first reference voltage, and a second closed loop operational amplifier which amplifies a signal output from the first closed loop operational amplifier based on a second reference voltage to generate a final output signal, the DC offset compensation circuit comprising:
   a buffer which buffers a signal output from the second closed loop operational amplifier;
   a low-pass filter which low-pass filters a signal output from the buffer and detects a DC voltage value of the signal; and
   a comparator which compares the DC voltage value with the second reference voltage, generates a compensation voltage based on the compared result, and supplies the compensation voltage as the first reference voltage to the first closed loop operational amplifier.

2. The DC offset compensation circuit of claim 1, wherein a cut-off frequency of the low-pass filter varies with a frequency of the input signal.

3. The DC offset compensation circuit of claim 1, wherein the comparator comprises:
   an operational amplifier which receives the detected DC voltage value at a positive input node;
   a first resistor which is connected between a negative input node of the operational amplifier and the second reference voltage; and
   a second resistor which is connected between the negative input node of the operational amplifier and an output node of the operational amplifier.

4. A closed loop operational amplifier comprising:
   a first closed loop operational amplifier which amplifies an input signal based on a compensation voltage;
   a second closed loop operational amplifier which amplifies a signal output from the first closed loop operational amplifier based on a reference voltage to generate a final output signal; and
   a DC offset compensation circuit which receives the final output signal, detects a DC voltage of the final output signal that varies with a variation in a DC voltage of the input signal, and supplies the compensation voltage corresponding to the DC voltage of the final output signal to the first closed loop operational amplifier.

5. The closed loop operational amplifier of claim 4, wherein the DC offset compensation circuit comprises:
   a buffer which buffers the final output signal;
   a low-pass filter which low-pass filters a signal output from the buffer to detect a DC voltage value of the signal; and
   a comparator which compares the DC voltage value with the reference voltage and generates the compensation voltage based on the compared result.

6. The closed loop operational amplifier of claim 5, wherein a cut-off frequency of the low-pass filter varies with a frequency of the input signal.

7. The closed loop operational amplifier of claim 5, wherein the comparator comprises:
   an operational amplifier which receives the detected DC voltage value at a positive input node;
   a first resistor which is connected between a negative input node of the operational amplifier and the reference voltage; and
   a second resistor which is connected between the negative input node of the operational amplifier and an output node of the operational amplifier.

8. The closed loop operational amplifier of claim 4, wherein the first closed loop operational amplifier comprises:
   an operational amplifier which receives the compensation voltage at a positive input node;
   a first resistor which is connected between a negative input node of the operational amplifier and the input signal; and
   a second resistor which is connected between the negative input node of the operational amplifier and an output node of the operational amplifier.

9. The closed loop operational amplifier of claim 4, wherein the second closed loop operational amplifier comprises:
   an operational amplifier which receives the reference voltage at a positive input node;
   a first resistor which is connected between a negative input node of the operational amplifier and an output node of the first closed loop operational amplifier; and
   a second resistor which is connected between the negative input node of the operational amplifier and an output node of the operational amplifier.

10. A closed loop operational amplifier comprising:
    a first closed loop operational amplifier which amplifies an input signal based on a compensation voltage;
    a second closed loop operational amplifier which amplifies a signal output from the first closed loop operational amplifier based on a reference voltage to generate a final output signal; and a DC offset compensation circuit which receives the final output signal, detects a DC voltage of the final output signal that varies with a variation in a DC voltage of the input signal, and supplies the compensation voltage corresponding to the DC voltage of the final output signal to the first closed loop operational amplifier, wherein the DC offset compensation circuit comprises:
a buffer which buffers the final output signal;
a low-pass filter which low-pass filters a signal output from the buffer to detect a DC voltage value of the signal; and
a comparator which compares the DC voltage value with the reference voltage and generates the compensation voltage based on the compared result.

11. The closed loop operational amplifier of claim 10, wherein a cut-off frequency of the low-pass filter varies with a frequency of the input signal.

12. The closed loop operational amplifier of claim 10, wherein the comparator comprises:
an operational amplifier which receives the detected DC voltage value at a positive input node;
a first resistor which is connected between a negative input node of the operational amplifier and the reference voltage; and
a second resistor which is connected between the negative input node of the operational amplifier and an output node of the operational amplifier.

13. The closed loop operational amplifier of claim 10, wherein the first closed loop operational amplifier comprises:
an operational amplifier which receives the compensation voltage at a positive input node;
a first resistor which is connected between a negative input node of the operational amplifier and the input signal; and
a second resistor which is connected between the negative input node of the operational amplifier and an output node of the operational amplifier.

14. The closed loop operational amplifier of claim 10, wherein the second closed loop operational amplifier comprises:
an operational amplifier which receives the reference voltage at a positive input node;
a first resistor which is connected between a negative input node of the operational amplifier and an output node of the first closed loop operational amplifier; and
a second resistor which is connected between the negative input node of the operational amplifier and an output node of the operational amplifier.

15. A method of compensating a DC offset of a closed loop operational amplifier having a first closed loop operational amplifier which amplifies an input signal based on a first reference voltage and a second closed loop operational amplifier which amplifies a signal output from the first closed loop operational amplifier based on a second reference voltage to generate a final output signal, the method comprising:

buffering a signal output from the second closed loop operational amplifier;

low-pass filtering the buffered output signal to detect a DC voltage value of the buffered output signal;

comparing the detected DC voltage value with the second reference voltage and generating a compensation voltage based on the compared result; and supplying the compensation voltage as the first reference voltage to the first closed loop operational amplifier.

16. The method of claim 15, wherein low-pass filtering comprises low pass filtering at a low-pass filter, the cut-off frequency of which varies with a frequency of the input signal.

* * * * *